United States Patent [19]
Smith et al.

[11] Patent Number: 4,583,012
[45] Date of Patent: Apr. 15, 1986

[54] LOGICAL CIRCUIT ARRAY

[75] Inventors: Kent F. Smith; Tony M. Carter, both of Salt Lake City, Utah

[73] Assignee: General Instrument Corporation, New York, N.Y.

[21] Appl. No.: 543,956

[22] Filed: Oct. 20, 1983

[51] Int. Cl.$^4$ ............... H03K 19/177; H03K 19/096; H03K 19/20; G06F 7/48
[52] U.S. Cl. ............................ 307/465; 307/452; 307/469; 307/481; 364/716
[58] Field of Search ............... 307/445, 448, 452, 453, 307/465, 468, 469, 481; 340/825.79, 825.83, 825.87, 825.91; 364/716

[56] References Cited
U.S. PATENT DOCUMENTS

| | | | |
|---|---|---|---|
| 4,207,616 | 6/1980 | Heeren | 307/468 X |
| 4,208,728 | 6/1980 | Blahut et al. | 307/469 X |
| 4,409,499 | 10/1983 | Zapisek et al. | 307/468 |
| 4,501,977 | 2/1985 | Koike | 307/469 |
| 4,506,341 | 3/1985 | Kalter | 307/465 X |

*Primary Examiner*—Larry N. Anagnos
*Attorney, Agent, or Firm*—Barry R. Lipsitz

[57] ABSTRACT

A logical circuit array is provided in which the AND and OR planes are folded together and all of the logic cell transistor gates are oriented in the same direction. The array comprises a plurality of AND rows $R_0$ through $R_n$, and means for precharging the AND rows to one logic level, e.g. $V_{DD}$. An additional row $R_a$ is provided along with means for precharging the additional row to another logic level, e.g., ground. The array includes a plurality of data columns and an output column coupled to AND row $R_0$. A plurality of logic cells is divided among AND rows $R_0$ through $R_{n-1}$. Each of the logic cells has an input terminal coupled to a data column, a first output terminal connected to the AND row with which the logic cell is associated, and a second output terminal connected to the next successive AND row in the array. A plurality of logic cells is associated with AND row $R_n$, with each such cell having an input terminal coupled to a data column, a first output terminal connected to AND row $R_n$, and a second output terminal connected to additional row $R_a$. In the array, the AND conditions of signals on the data columns are formed on the AND rows by the logic cells associated therewith, and the OR condition of the AND rows is formed on the output column.

6 Claims, 8 Drawing Figures

FIG. 1.

|   | K | C | A₁ | A₀ | D₁ | D₀ |
|---|---|---|---|---|---|---|
| HOLD PRESENT COUNT | 0 | 0 | 0 | 0 | 0 | 0 |
|  | 0 | 0 | 0 | 1 | 0 | 1 |
|  | 0 | 0 | 1 | 0 | 1 | 0 |
|  | 0 | 0 | 1 | 1 | 1 | 1 |
| COUNT | 0 | 1 | 0 | 0 | 0 | 1 |
|  | 0 | 1 | 0 | 1 | 1 | 0 |
|  | 0 | 1 | 1 | 0 | 1 | 1 |
|  | 0 | 1 | 1 | 1 | 0 | 0 |
| CLEAR | 1 | 0 | 0 | 0 | 0 | 0 |
|  | 1 | 0 | 0 | 1 | 0 | 0 |
|  | 1 | 0 | 1 | 0 | 0 | 0 |
|  | 1 | 0 | 1 | 1 | 0 | 0 |
|  | 1 | 1 | 0 | 0 | 0 | 0 |
|  | 1 | 1 | 0 | 1 | 0 | 0 |
|  | 1 | 1 | 1 | 0 | 0 | 0 |
|  | 1 | 1 | 1 | 1 | 0 | 0 |

FIG. 2.

$$D_0 = \bar{K}\bar{C}A_0 + \bar{K}C\bar{A}_0$$

FIG. 3.

$$D_1 = \bar{K}\bar{C}A_1 + \bar{K}C\bar{A}_1 A_0 + \bar{K}A_1\bar{A}_0$$

AND PLANE
PLA WITH D-TYPE FLIP/FLOP

OR PLANE

LOGICAL CIRCUIT ARRAY

BACKGROUND OF THE INVENTION

The present invention relates to logical circuit arrays, and more particularly to an array topology for a dynamic logical circuit array, in which the AND and OR planes are folded together, with the gates of all logic cell transistors oriented in the same direction when the array is fabricated as an integrated circuit.

In the past, programmable logic arrays have been used to provide complex electronic circuitry on semiconductor chips. Typically, the circuit components, e.g. transistors, which form the programmable logic array are arranged in a grid-like manner, using horizontal "rows" and vertical "columns" for carrying various signals. One section of such programmable logic arrays uses rows to form an "AND plane". Another section uses columns to form an "OR plane".

The AND plane functions by looking at data which is present on various data columns in the array (separate from the columns which constitute the OR plane), and if the condition of all of the data columns looked at is "true", the associated AND plane row will be driven so that it is also "true". Thus, the AND function is a logical function in which the output follows the input if, and only if, all of the input signals are "true".

The OR plane of a programmable logic array looks at selected rows of the AND array, and if any one or more of the rows looked at are "true", the associated OR column will be forced "true". Thus, if any one of the inputs which the OR plane looks at is "true", i.e., the first input is true "or" the second input is true "or" the third input is true, etc., the output of the OR plane will be "true".

In addition to the AND plane and OR plane, other elements, such as memory cells, can be incorporated into a programmable logic array. With proper interconnection, the elements of a programmable logic array can be designed to perform many different functional tasks, thereby providing specialized digital processors for almost any end use imaginable.

One drawback to programmable logic arrays known in the art is that since the rows associated with the AND plane are horizontal, and the columns associated with the OR plane are vertical, the transistors associated with the AND plane are rotated 90° with respect to the transistors associated with the OR plane. This presents difficulty in fabricating programmable logic arrays, in the form of integrated circuits, without wasting space on the semiconductor chip. In one attempt to save space, the AND plane and OR plane have been "folded" together, so that the transistors which provide the AND and OR functions are intermingled in one area of the array, instead of the AND plane being placed in one section of the array, with the OR plane in another section. Even in structures where the AND and OR planes have been folded, the AND and OR transistors were rotated 90° with respect to one another.

It would be advantageous to provide a logical circuit array structure in which the array transistors all have their gates oriented in one direction, and do not have to be rotated by 90° for the AND and OR plane connections. Such a structure would enjoy enormous space savings over prior programmable logic array designs. The present invention provides such a structure.

SUMMARY OF THE INVENTION

A logical circuit array is provided which comprises a plurality of AND rows $R_0$ through $R_n$ and means for precharging the AND rows to one logic level. An additional row $R_a$ is provided along with means for precharging the additional row to another logic level. A plurality of data columns are provided, and an output column is coupled to AND row $R_0$. A plurality of logic cells is divided among AND rows $R_0$ through $R_{n-1}$, each logic cell having an input terminal coupled to a data column, a first output terminal connected to the AND row with which the logic cell is associated, and a second output terminal connected to the next successive AND row in the array. A plurality of logic cells is also associated with AND row $R_n$, each logic cell associated with AND row $R_n$ having an input terminal coupled to a data column, a first output terminal connected to AND row $R_n$, and a second output terminal connected to additional row $R_a$. The AND conditions of signals on the data columns are formed on the AND rows by the logic cells associated therewith, and the OR condition of the AND rows is formed on the output column.

The array can be expanded by providing additional groups of AND rows with associated logic cells, and means for precharging the additional AND rows to said one logic level. In such an expanded array, means are provided for coupling the first row of each additional group to an output column, and for coupling the last row of each additional group to the additional row $R_a$. Memory elements can be interspersed within the array to enable complex logical functions to be implemented. Such memory elements can have an input coupled to one of the output columns and an output coupled to drive one of the data columns.

A logical circuit array in accordance with the present invention can be implemented in any of the well known technologies, such as NMOS or CMOS. In a preferred embodiment, the "one logic level" to which the AND rows are charged is a logical high, and the "another logic level" to which the additional row is precharged is ground. In operation, the OR condition of the AND rows is formed by discharging successive AND rows to ground via additional row $R_a$, in effect rippling the logic level of additional row $R_a$ through the AND rows until it reaches row $R_0$, to which the output column is coupled.

The present invention also provides a method for processing data in a logic array comprising the steps of precharing a plurality of AND rows to one logic level, precharging an additional row to another logic level, arranging a plurality of logic cells in each AND row to form on each respective AND row the AND condition of data from a plurality of data columns driving the logic cells in that AND row, coupling the AND rows and the additional row together through the logic cells, and rippling the logic level of the additional row through the logic cells to successive AND rows to form the OR condition of all of the AND rows on the AND row most remotely coupled to the additional row. The method can comprise the further step of reading the OR condition of the AND rows from an OR column coupled to the AND row which is most remotely coupled to the additional row. The additional row can be precharged to ground, and the AND rows precharged to a logical high.

BRIEF DESCRIPTION OF THE DRAWINGS

FIG. 1 is a truth table for a two bit counter;

FIG. 2 is a Karnaugh map for the $D_0$ term of the truth table of FIG. 1;

FIG. 3 is a Karnaugh map for the $D_1$ term of the truth table of FIG. 1;

DETAILED DESCRIPTION OF A PREFERRED EMBODIMENT

The present invention will be described through the implementation of a two bit counter. A two bit counter is just one of the almost infinite number of different circuits which could be implemented in accordance with the present invention. However, in order to demonstrate the advantages and operation of the present invention, the simple two bit counter serves as a useful example.

The truth table for a two bit counter is shown in FIG. 1. The K and C signals are clear and count inputs to the counter, respectively. $A_1$ and $A_0$ are the present state of the two D type flip-flops in the counter. $D_1$ and $D_2$ are the next state D inputs to the counter.

In the design of digital systems, truth tables, such as that shown in FIG. 1, can be simplified and expressed as a logical expression. The form most desirable for circuit synthesis is the so-called "sum of products" form. In this form, the expression is given as a "sum" of terms, each of which is a simple "product" of variables or their complements. A sum of products expression can be further simplified to the "minimal" sum of products expression. By casting a truth table, such as that shown in FIG. 1, in a slightly different form, the minimal expression may be written by inspection. In particular, it is useful to rearrange the truth table in a two-dimensional form, called a Karnaugh map. Karnaugh maps for the $D_0$ and $D_1$ terms of the truth table of FIG. 1, are shown in FIGS. 2 and 3 respectively. Each square in a Karnaugh map corresponds to some particular combination of terms. Thus, each square in the map corresponds to a line in the truth table. In the Karnaugh map of FIG. 2, the terms K and C are stacked vertically, and the terms $A_1$ and $A_0$ appear horizontally. The corresponding $D_0$ term appears within the map. $D_0$ is "true" whenever a 1 appears in the map. The minimal sum of products expression is determined by grouping adjacent true terms in the map, as shown by the dotted lines in FIG. 2. As shown, $D_0$ is true whenever K and C are both 0, and $A_0$ is 1; or whenever K and $A_0$ are 0, and C is 1. Thus, the minimal sum of products expression for term $D_0$ is $D_0 = \overline{K}\,\overline{C}\,A_0 + \overline{K}\,C\,\overline{A_0}$. Similarly, the minimal sum of products expression for the term $D_1$ can be determined by examining the Karnaugh map of FIG. 3. As shown, $D_1 = \overline{K}\,C\,A_1 + \overline{K}\,\overline{C}\,A_1\,A_0 + \overline{K}\,A_1\,\overline{A_0}$. In these equations, the symbol "+" means a logical "OR". Thus, one would read the equation for $D_0$ as: "$D_0$ equals not K *and* not C *and* $A_0$ *or* not K *and* C *and* not $A_0$."

Figure 4:
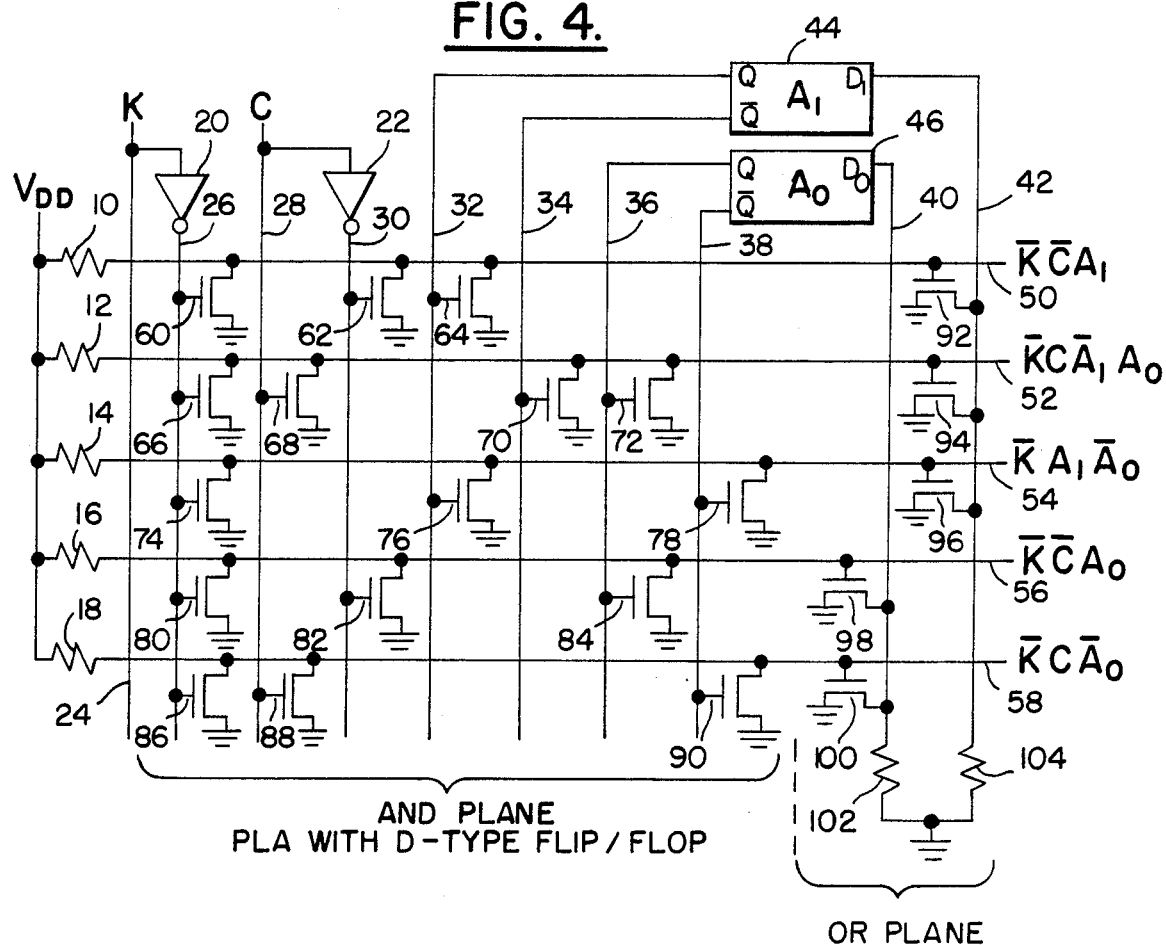
FIG. 4 is a schematic representation of a conventional programmable logic array implementing the truth table of FIG. 1.

After the minimal sum of products expressions have been determined for a truth table, a digital circuit to implement the truth table can be designed. FIG. 4 shows a design for the truth table of FIG. 1, which is implemented in a prior-art type programmable logic array ("PLA") structure. A full understanding of this prior art structure will enable the reader to appreciate the differences, and substantial advantages, of the structure of the present invention.

FIG. 4 shows a programmable logic array having a plurality of rows 50, 52, 54, 56 and 58 and a plurality of data columns 24, 26, 28, 30, 32, 34, 36, and 38. These data columns are associated with the AND plane of the array. Output columns 40 and 42, which are associated with the OR plane of the array, are also provided. Pullup resistors 10, 12, 14, 16, and 18, are connected between voltage source $V_{DD}$ and rows 50, 52, 54, 56, and 58 respectively. Each of the rows in the array carries out an AND function. The array shown in FIG. 4 has been arranged so that the top three rows, 50, 52, and 54, each perform one of the AND conditions of the minimal sum of products expression for $D_1$ shown in FIG. 3. The last two rows in the array of FIG. 4, rows 56 and 58, each perform one of the AND conditions of the minimal sum of products expression for $D_0$, shown in FIG. 2.

Column 24 of the array of FIG. 4 represents the K input of the truth table of FIG. 1. The K input is inverted by inverter 20, which causes the complement of the K input, or $\overline{K}$ to appear on data column 26. Similarly, input C appears on data column 28, and $\overline{C}$, through the action of inverter 22, appears on data column 30.

D-type flip flops 44 and 46 correspond to the $A_1$ and $D_1$ terms, and the $A_0$ and $D_0$ terms, respectively. The present state of flip flop 44 will be present on outputs Q and $\overline{Q}$ of the flip flop, which, respectively, are equivalent to the $A_1$ and $\overline{A_1}$ terms. Thus, $A_1$ is represented by data column 32, and $\overline{A_1}$ is represented by data column 34. In the same manner, $A_0$ is represented by data column 36, and $\overline{A_0}$ is represented by data column 38.

In order to implement the first AND condition, $\overline{K}\,\overline{C}\,A_1$, of the minimal sum of products expression for $D_1$, logic cells, comprising transistors 60, 62, and 64, are used in conjunction with row 50 of the array. The input electrodes of the transistors are coupled to data columns, and the output electrodes thereof are coupled between row 50 and ground. The input electrode of transistor 60 is coupled to data column 26, which is the $\overline{K}$ input. The input electrode of transistor 62 is coupled to data column 30, which is the $\overline{C}$ input. The input electrode of transistor 64 is connected to data column 32, which is the $A_1$ term. Thus, row 50 of the array represents the AND condition $\overline{K}\,\overline{C}\,A_1$.

In a similar manner, row 52 represents the AND condition $\overline{K}\,C\,A_1\,A_0$, row 54 represents the AND condition $\overline{K}\,A_1\,\overline{A_0}$, row 56 represents the AND condition $\overline{K}\,\overline{C}\,A_0$, and row 58 represents the AND condition $\overline{K}\,C\,\overline{A_0}$. It will be noted that the input electrodes of all of the transistors in the AND plane of the array are oriented in the same direction.

In order to complete the design of the two bit counter, the OR conditions (designated "+") of the minimal sum of products expressions must be provided for. $D_1$ comprises the OR condition of three AND conditions. The OR functions are provided by logical cells which comprise transistors 92, 94, and 96 connected to rows 50, 52, and 54 respectively. If any one of the three AND conditions of rows 50, 52, or 54 is true, than output column 42, coupled to $D_1$, will be true.

The OR condition of rows 56 and 58 of the array will be reflected on output column 40, through the action of the logic cells comprising transistors 98 and 100 associated with rows 56 and 58, respectively. Output column 40 is coupled to the $D_0$ input of flip flop 46.

It is important to note that the input electrodes of each of OR transistors 92, 94, 96, 98, and 100 are coupled to rows. Accordingly, the OR logic cells comprising these transistors are rotated by 90° with respect to the AND logic cells which are present in the AND plane. The necessity of rotating the AND and OR logic cells by 90° with respect to one another presents difficulty in fabricating programmable logic arrays, in the form of integrated circuits, without wasting space on the semiconductor chip. The present invention overcomes this substantial disadvantage.

Figure 5:
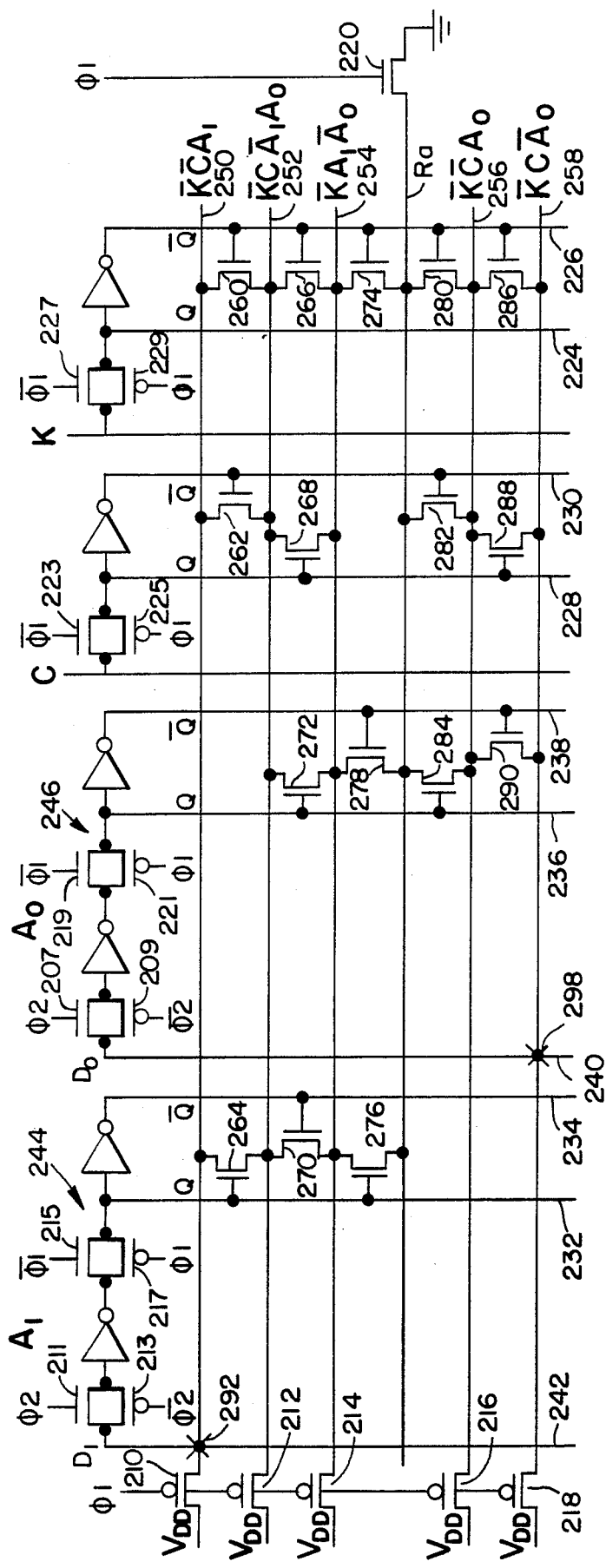
FIG. 5 is a schematic representation implementing the truth table of FIG. 1 in accordance with the present invention.

An implementation of the same two bit counter, but using the structure of the present invention, is shown in FIG. 5. As is evident, the input electrodes of all of the logic cell transistors in this structure are connected to columns, and therefore, the transistors are all oriented such that their control electrodes extend horizontally. There is no 90° rotation of transistors as there was in the prior art type programmable logic array shown in FIG. 4.

The AND rows 250, 252, 254, 256, and 258 in FIG. 5 correspond to AND rows 50, 52, 54, 56, and 58 in FIG. 4. The structure shown in FIG. 5 includes an additional row $R_a$. The AND rows shown in FIG. 5 are precharged to one logic level, $V_{DD}$, by p-type transistors 210, 212, 214, 216, and 218 which are clocked by clock signal $\Phi_1$. The additional row $R_a$ is precharged to ground by n-type transistor 220, also clocked by clock signal $\overline{\Phi_1}$.

The K and $\overline{K}$ inputs appear on columns 224 and 226 respectively. The C and $\overline{C}$ inputs appear on columns 228 and 230 respectively. Memory element 244, which is a dynamic shift register, has its $A_1$ output on data column 232 and its $\overline{A_1}$ output on data column 234. Memory element 246, also a dynamic shift register, has its $A_0$ output on data column 236, and its $\overline{A_0}$ output on data column 238. Output $D_0$ appears on output column 240, which is directly connected to row 258 of the array at contact 298. Similarly, output $D_1$ appears on output column 242, which is directly connected to row 250 at contact 292.

Figure 6:
FIG. 6 is a timing diagram of the two clocks used in the implementation shown in FIG. 5.

In operation, each of the rows of the two bit counter array shown in FIG. 5 is precharged to voltage $V_{DD}$ when $\Phi_1$ goes low at time $t_1$, as shown in FIG. 6. At the same time, $\Phi_1$ causes data to be shifted through memory element 244 by transistors 215, 217; through memory element 246 by transistors 219, 221; to data columns 228, 230 by transistors 223, 225; and to data columns 224, 226 by transistors 227, 229. During time $t_1$, both clock signals $\Phi_1$ and $\Phi_2$ are low.

During time period $t_2$, clock signal $\Phi_1$ goes high, which causes transistor 220 to precharge additional row $R_a$ to ground. This will cause the OR condition of AND rows 250, 252, and 254 to be inherently transfered to row 250. Also during time $t_2$, the OR condition of AND rows 256 and 258 will be transfered to row 258. At time $t_3$, clock signal $\Phi_2$ goes high, so that data can be read from the OR columns 242 and 240 into memory elements 244 and 246 via transistors 211, 213 and 207, 209, respectively. Thus, during time period $t_3$, the OR conditions of the AND rows will be transfered into the memory elements. Time period $t_4$, during which $\Phi_1$ is high and $\Phi_2$ is low, enables the transfer of data into the memory elements to cease prior to commencing the next precharge cycle of the AND rows.

The structure of the present invention operates, in effect, by selectively rippling the logic level of additional row $R_a$ through the logic cells associated with AND rows. A true signal on a data column will prevent any logic cell connected to that data column from becoming conductive. Thus, if any of the AND conditions are satisfied, the logic level from additional row $R_a$ will be prevented from rippling across the applicable AND row to the next successive AND row, and the AND row most remotely coupled to additional row $R_a$ will remain precharged, so that the output column connected thereto will remain high.

Figure 7:
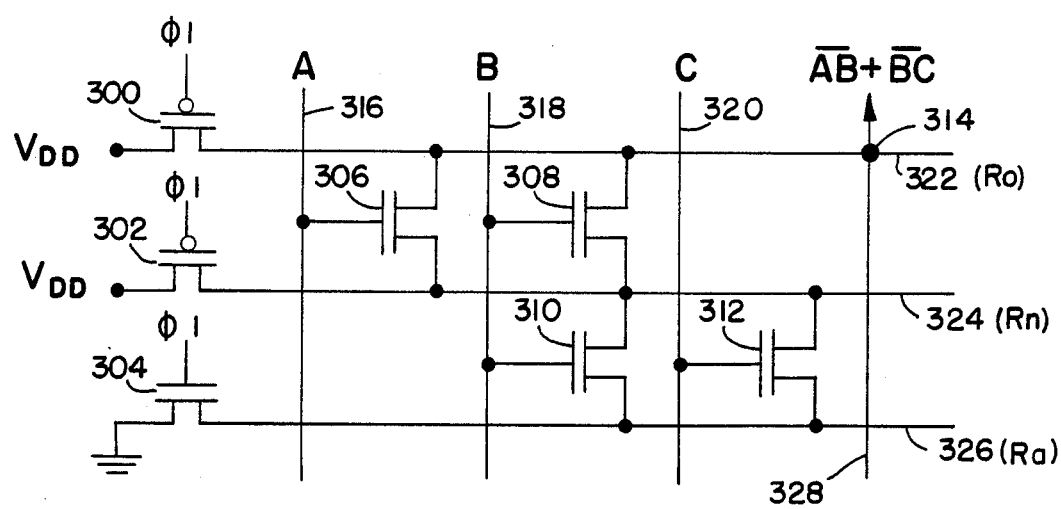
FIG. 7 is a simple example of a logical circuit array in accordance with the present invention.
Figure 8:
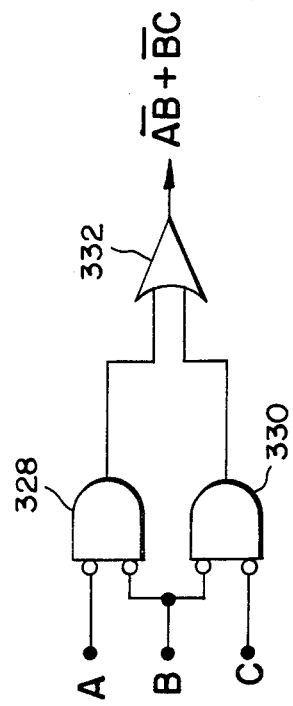
FIG. 8 is a logical representation of the array of FIG. 7.

In order to more clearly explain the operation of the present invention, a simple logical circuit, in accordance with the invention, is shown in FIG. 7. FIG. 8 shows the logic diagram for the circuit of FIG. 7. In particular, the circuit provides the logical OR (through OR gate 332) of two NAND gates 328 and 330. In algebraic terms, the output of the circuit is exressed as $\overline{AB} + \overline{BC}$.

The array of FIG. 7 contains AND row 322, designated $R_0$, and AND row 324, designated $R_n$. An additional row 326, designated $R_a$, is also provided. Data columns 316, 318, and 320 carry input signals A, B, and C respectively.

AND rows $R_0$ and $R_n$ are precharged through transistors 300 and 302 respectively, to one logic level, $V_{DD}$. Precharging occurs when a clock signal $\Phi_1$ goes low. When clock signal $\Phi_1$ goes high, additional row $R_a$ is precharged to another logic level, which in the example shown, is ground. If the logic level of either signals A and B or signals B and C is low, there will be no path through which the ground logic level from additional row $R_a$ can ripple through to AND row $R_0$ Thus, row $R_0$ will remain at voltage level $V_{DD}$, and the OR output column 328, which is connected to row $R_0$ at 314, will be high.

If, on the other hand, the logical expression $\overline{AB} + \overline{BC}$ is not met, a path will exist, through some combination of the logic cells formed by transistors 306, 308, 310, and 312, which will ripple the ground potential of additional row $R_a$ through the circuit to row $R_0$. For example, if signal B is high, transistors 308 and 310 will be turned on, thereby connecting additional row $R_a$ to AND row $R_0$. If signals A and C are both high, additional row $R_a$ will be connected to AND row $R_0$ through transistors 306 and 312, which will both be turned on.

It will now be appreciated that the present invention provides a dynamic, compact logical circuit array, where all of the logic cell transistors are oriented in the same direction. This is accomplished by providing a plurality of AND rows along with an additional row. The AND rows are precharged to one logic level, and the additional row is precharged to another logic level. If a predefined logical condition is not met, the logic cells, which read data off of data columns, will provide a path which connects the additional row to the first AND row, thereby rippling the logic level of the additional row through to the first AND row. The OR condition of the AND rows is formed on an output column connected to the first AND row.

In a complex logical circuit array built in accordance with the present invention, additional groups of AND rows with associated logic cells can be provided, with means for precharging the additional AND rows to one logic level. One or more additional rows, which are precharged to another logic level, will be provided so that the OR condition of each group of AND rows can be formed by rippling the logic level of the additional row or rows to an output column connected to the first AND row in each group.

Complex cells, other than those needed to perform the AND/OR products of a function, can be provided and may be inserted into the array at arbitrary locations. These include flip flops, inverters, loads, row and column connections, pass transistors, etc. The AND/OR cells are of unit size, one row high and one column wide, but the complex cells are composed of multiples of the rows and columns. The columns and rows of the array can be divided into any number of segments desired, allowing great design flexibility.

The implementation of the present invention shown in FIGS. 5 and 7 comprises dynamic CMOS. Those skilled in the art will appreciate that other technologies, such as NMOS, can also be used to implement an array in accordance with the present invention.

Although a preferred embodiment of the present invention has been disclosed for purposes herein, it is to be understood that many variations and modifications could be made thereto. It is intended to cover all of these variations and modifications which fall within the scope of the present invention, as set forth herein and defined by the appended claims.

We claim:

1. A logical circuit array comprising:
   a plurality of AND rows $R_0$ through $R_n$;
   means for precharging said AND rows to one logic level;
   an additional row $R_a$;
   means for precharging said additional row to another logic level;
   a plurality of data columns;
   a plurality of logic cells divided among each of AND rows $R_0$ through $R_{n-1}$, each logic cell having an input terminal coupled to a data column, a first output terminal connected to the AND row with which the logic cell is associated, and a second output terminal connected to the next successive AND row in the array;
   a plurality of logic cells associated with AND row $R_n$, each logic cell associated with AND row $R_n$ having an input terminal coupled to a data column, a first output terminal connected to AND row $R_n$, and a second output terminal connected to additional row $R_a$;
   an output column coupled to AND row $R_0$; and
   a memory element having an input coupled to said output column and an output coupled to drive one of said data columns;
   whereby the AND conditions of signals on the data columns are formed on the AND rows by the logic cells associated therewith, and the OR condition of the AND rows is formed on the output column.

2. The array of claim 1 further comprising:
   additional groups of AND rows with associated logic cells;
   means for precharging said additional AND rows to said one logic level;
   means for coupling the first row of each additional group to an output column; and
   means for coupling the last row of each additional group to said additional row $R_a$.

3. The array of claim 1 wherein said means for precharging said AND rows operates during a first time period in response to a first clock pulse; and said means for precharging said additional row operates during a second time period after said first time period.

4. The array of claim 1 wherein said AND rows are precharged to a logical high, and said additional row is precharged to ground.

5. A method for processing data in a logic array comprising the steps of:
   precharging a plurality of AND rows to one logic level;
   precharging an additional row to another logic level;
   arranging a plurality of logic cells in each AND row to form on each respective AND row the AND condition of data from a plurality of data columns driving the logic cells in that AND row;
   coupling said AND rows and said additional row together through said logic cells;
   rippling the logic level of said additional row through said logic cells to successive AND rows to form the OR condition of all of said AND rows on the AND row coupled most remotely to said additional row;
   reading the OR condition of said AND rows from an OR column coupled to the AND row which is most remotely coupled to said additional row; and
   driving at least one of said data columns with data output from a memory element which has an input coupled to said OR column.

6. The method of claim 5 wherein said additional row is precharged to ground, and said AND rows are precharged to a logical high.

* * * * *